(12) United States Patent
Kanamoto et al.

(10) Patent No.: US 7,791,097 B2
(45) Date of Patent: Sep. 7, 2010

(54) NITRIDE SEMICONDUCTOR DEVICE AND MANUFACTURING METHOD OF THE SAME

(75) Inventors: Kyozo Kanamoto, Tokyo (JP); Katsuomi Shiozawa, Tokyo (JP); Kazushige Kawasaki, Tokyo (JP); Hitoshi Sakuma, Tokyo (JP); Junichi Horie, Tokyo (JP); Toshihiko Shiga, Tokyo (JP); Toshiyuki Oishi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 205 days.

(21) Appl. No.: 11/772,644

(22) Filed: Jul. 2, 2007

(65) Prior Publication Data

US 2008/0023799 A1 Jan. 31, 2008

(30) Foreign Application Priority Data

Jul. 25, 2006 (JP) ............................. 2006-201652

(51) Int. Cl.
*H01L 29/207* (2006.01)
*H01L 21/20* (2006.01)
(52) U.S. Cl. ................ 257/99; 257/79; 257/E33.062
(58) Field of Classification Search ................ 257/613, 257/615, E21.09, E29.093
See application file for complete search history.

(56) References Cited

U.S. PATENT DOCUMENTS

| 5,561,316 | A  | * | 10/1996 | Fellner ................. 257/549 |
| 6,611,004 | B2 | * | 8/2003 | Morimoto ............... 257/99 |
| 6,682,991 | B1 | * | 1/2004 | Hino et al. ............. 438/481 |
| 6,849,875 | B2 | * | 2/2005 | Ishida .................... 257/79 |
| 7,132,730 | B2 | * | 11/2006 | Dwili ski et al. ......... 257/615 |
| 7,176,479 | B2 | * | 2/2007 | Ohba ..................... 257/12 |
| 7,285,800 | B2 | * | 10/2007 | Lai et al. ................ 257/81 |
| 7,312,472 | B2 | * | 12/2007 | Chiyo et al. ............. 257/79 |
| 7,385,252 | B2 | * | 6/2008 | Lee et al. ............... 257/355 |

(Continued)

FOREIGN PATENT DOCUMENTS

JP 2967743 8/1999

(Continued)

OTHER PUBLICATIONS

U.S. Appl. No. 12/641,421, filed Dec. 18, 2009, Shiozawa, et al.

(Continued)

*Primary Examiner*—Leonardo Andújar
*Assistant Examiner*—William Harriston
(74) *Attorney, Agent, or Firm*—Oblon, Spivak, McClelland, Maier & Neustadt, L.L.P.

(57) ABSTRACT

A nitride semiconductor device includes an n-type GaN substrate with a semiconductor device formed thereon and an n-type electrode which is a metal electrode formed on the rear surface of the GaN substrate. A surface modified layer and a reaction layer are interposed between the GaN substrate and n-type electrode. The surface modified layer serves as a carrier supplying layer, and is formed by causing the rear surface of the GaN substrate to react with a Si-containing plasma to be modified. The reaction layer is generated by partially removing a deposited material deposited on the surface modified layer by cleaning to generate a deposited layer and then causing Ti contained in a first metal layer and the deposited layer to partially react by heat treatment.

10 Claims, 8 Drawing Sheets

U.S. PATENT DOCUMENTS

| | | | |
|---|---|---|---|
| 7,397,834 B2 * | 7/2008 | Kozaki et al. | 372/46.012 |
| 7,405,096 B2 * | 7/2008 | Kano et al. | 438/46 |
| 7,408,199 B2 * | 8/2008 | Matsuyama et al. | 257/79 |
| 7,420,261 B2 * | 9/2008 | Dwili ski et al. | 257/615 |
| 7,485,900 B2 * | 2/2009 | Nonaka et al. | 257/99 |
| 7,550,374 B2 * | 6/2009 | Song et al. | 438/604 |
| 2003/0121468 A1 * | 7/2003 | Boone et al. | 117/78 |
| 2004/0245540 A1 * | 12/2004 | Hata et al. | 257/99 |
| 2005/0184299 A1 * | 8/2005 | Matsumura et al. | 257/79 |
| 2007/0057276 A1 * | 3/2007 | Kiyoku et al. | 257/103 |
| 2008/0273562 A1 * | 11/2008 | Hasegawa et al. | 372/44.01 |

FOREIGN PATENT DOCUMENTS

| | | |
|---|---|---|
| JP | 2003-347660 | 12/2003 |
| JP | 2004-6718 | 1/2004 |
| JP | 2005-268769 | 9/2005 |

OTHER PUBLICATIONS

U.S. Appl. No. 11/844,707, filed Aug. 24, 2007, Shiozawa, et al.

* cited by examiner

F I G. 3
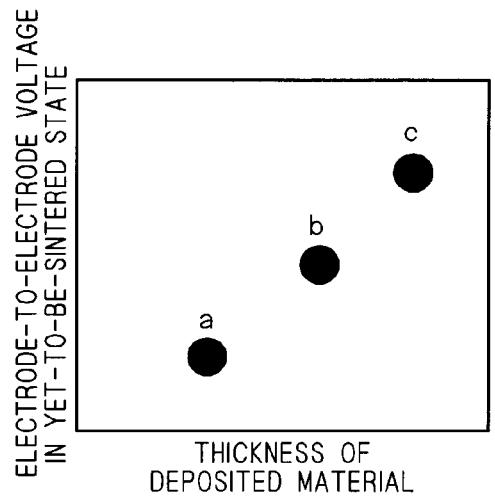
F I G. 4
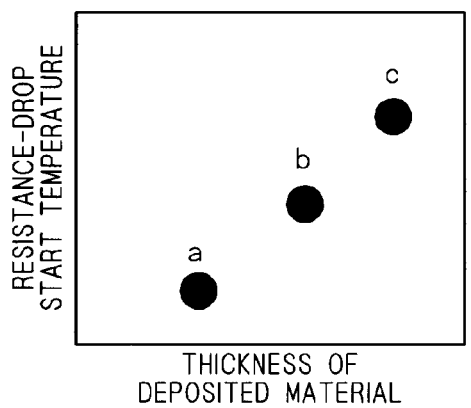
F I G. 5
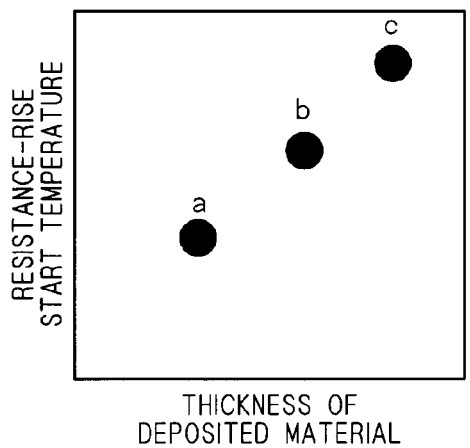

Atomic%
Ga 23.8
O 37.4
C 10.2
N 7.2
Si 21.4

F I G . 1 1
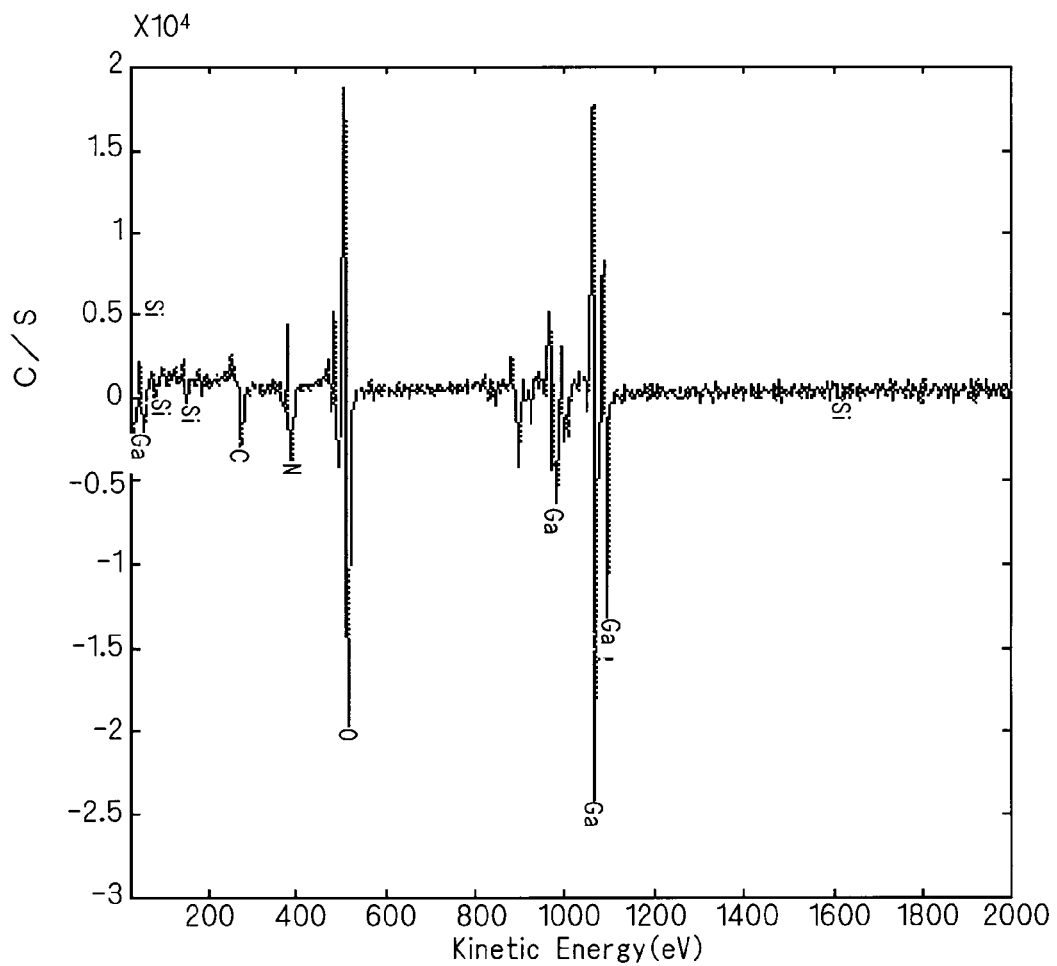

NITRIDE SEMICONDUCTOR DEVICE AND MANUFACTURING METHOD OF THE SAME

FIELD OF THE INVENTION

The present invention relates to a nitride semiconductor device and a manufacturing method of the same, and more particularly to a nitride semiconductor device having an n-type electrode on the rear surface of a nitride semiconductor substrate and a manufacturing method of the same.

DESCRIPTION OF THE BACKGROUND ART

Methods of forming an electrode on a nitride semiconductor substrate such as GaN include polishing a substrate, and further removing damage caused by polishing by dry etching and further, carrying out an oxygen plasma treatment, as disclosed in, for example, Japanese Patent No. 2,967,743 and Japanese Patent Application Laid-Open Nos. 2003-347660, 2004-6718 and 2005-268769. JP2005-268769 presents a manufacturing method of depositing an electrode after etching is carried out using gas containing a group IV element such as $SiC_4$ to intentionally dope the group IV element, thereby achieving a low resistance.

Such conventional manufacturing methods, however, do not satisfy both of ohmic characteristics and adhesion. One method is to obtain a low-resistance ohmic characteristics only after performing high heat treatment at 500° C. or higher after deposition of electrode; another one results in high resistance in heat treatment necessary for device assembly even while low-resistance ohmic characteristics are achieved without performing heat treatment; still another one does not achieve sufficient adhesion even while low-resistance ohmic characteristics are achieved.

More specifically, electric characteristics of a front-side device structure formed earlier may be degraded when high heat treatment is necessary. Further, when electric characteristics vary by heat treatment in the device assembly process, assembly may be carried out at low temperatures to prevent this, in which case, however, heat in an operation after the assembly may cause changes with time. Furthermore, devising electrode structure or subjecting the surface to acid treatment in order to improve adhesion may impose limitations on the process or may impair the low resistance having been obtained.

SUMMARY OF THE INVENTION

An object of the present invention is to provide a nitride semiconductor device capable of achieving low-resistance ohmic characteristics and good adhesion, and a manufacturing method of the same.

A first aspect of the present invention is directed to a manufacturing method of a nitride semiconductor device including the steps of (a) forming a layered structure of nitride semiconductor element on a first main surface of a nitride semiconductor substrate, (b) subjecting a second main surface of the nitride semiconductor substrate to a plasma treatment with gas containing one of a group IV element and a group VI element, thereby modifying the second main surface to generate a surface modified layer and forming a deposited material on the surface modified layer, (c) cleaning the deposited material to remove part of the deposited material and leave the rest of the deposited material as a deposited layer, (d) forming a metal electrode on the deposited layer, and (e) causing the deposited layer and the metal electrode to react by heat treatment, thereby generating a reaction layer.

This achieves low-resistance ohmic characteristics and good adhesion.

A second aspect of the present invention is directed to a nitride semiconductor device including a nitride semiconductor substrate, a layered structure of nitride semiconductor element provided on a first main surface of the nitride semiconductor substrate, a metal electrode provided on a second main surface of the nitride semiconductor substrate, a surface modified layer partially provided on the second main surface and containing one of a group IV element and a group VI element, and a reaction layer provided on the side of the surface modified layer on the metal electrode and containing one of the group IV element and the group VI element contained in the surface modified layer and a metal contained in the metal electrode.

This achieves low-resistance ohmic characteristics and good adhesion.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a graph schematically showing the relationship between the thickness of a deposited material and electrode-to-electrode voltage in the nitride semiconductor device according to the first preferred embodiment;

FIG. 4 is a graph schematically showing the relationship between the thickness of a deposited material and resistance-drop start temperature in the nitride semiconductor device according to the first preferred embodiment;

FIG. 5 is a graph schematically showing the relationship between the thickness of a deposited material and resistance-rise start temperature in the nitride semiconductor device according to the first preferred embodiment;

FIGS. 9 to 12 are graphs each showing the composition of a deposited layer of the nitride semiconductor device according to the first preferred embodiment.

DESCRIPTION OF THE PREFERRED EMBODIMENTS

Figure 1:
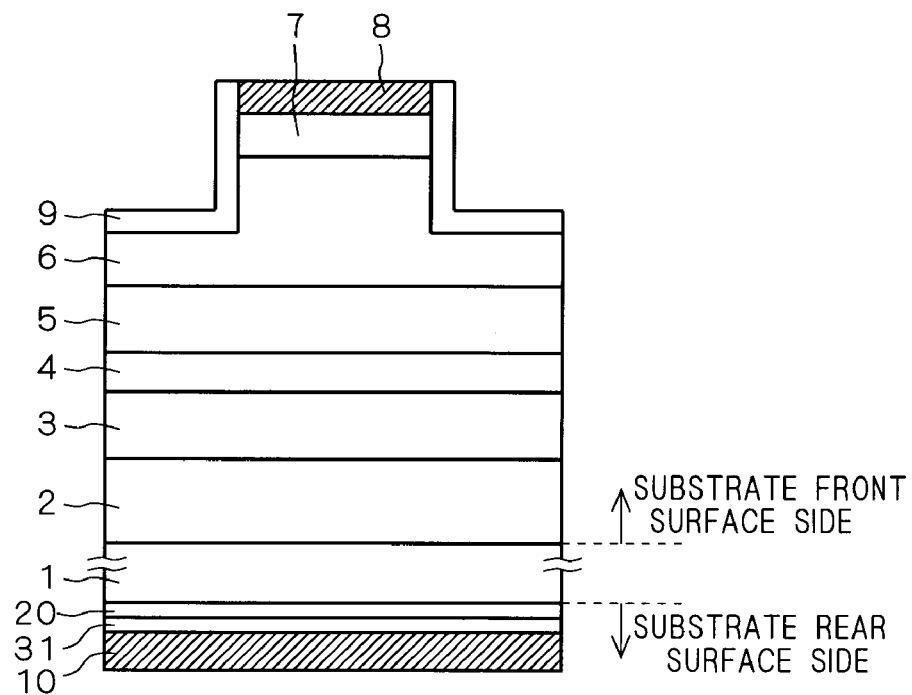
FIG. 1 is a diagram showing an exemplary structure of a nitride semiconductor device according to a first preferred embodiment of the present invention.

Preferred embodiments of the present invention will now be described in detail referring to the accompanied drawings and taking an application to a semiconductor laser device, as an example. Identical or corresponding components will be indicated by the same reference characters in the drawings, and description thereof may be simplified or omitted. When describing a surface of a substrate in the following description, the word "front surface" may be used to indicate both a surface opposite to a rear surface and a region within the substrate including the surface and an extremely shallow portion from the surface.

First Preferred Embodiment

FIG. 1 is a diagram showing an exemplary structure of a laser diode which is a nitride semiconductor device according to a first preferred embodiment of the present invention. As shown in the drawing, the semiconductor device is formed using an n-type GaN substrate 1 which is a nitride semiconductor substrate.

Formed on a front surface (first main surface) which is a Ga face of the GaN substrate 1 is a layered structure of nitride semiconductor including an n-type AlGaN cladding layer 2, an n-type GaN guide layer 3, an active layer 4, a p-type GaN guide layer 5, a p-type AlGaN cladding layer 6 and a p-type GaN contact layer 7. The GaN substrate 1 and the layered structure constitute a laser diode device (nitride semiconductor device). Mounted on the p-type GaN contact layer 7 is a p-type electrode 8. The p-type AlGaN cladding layer 6 and p-type GaN contact layer 7 are patterned into a predetermined shape by etching. The p-type electrode 8 is disposed on top of the p-type GaN contact layer 7. A $SiO_2$ film 9 serving as an insulation protecting film is formed so as to cover the top of the nitride semiconductor device and expose the upper surface of the p-type electrode 8.

Provided on the rear surface (second main surface) which is an N face of the GaN substrate 1 is an n-type electrode 10 which is a metal electrode. In the present embodiment, a surface modified layer 20 and a reaction layer 31 are interposed between the n-type electrode 10 and GaN substrate 1. This surface modified layer 20 is an extremely thin modified region of the outermost surface or one to two layers of the GaN substrate 1 (which is generally considered to have a depth of about one to two layers of crystal lattice from the outermost surface, but the depth is not limited as such, and a greater depth allows a lower resistance accordingly), and serves as a carrier supplying layer. It is noted that the surface modified layer 20 is described in detail in Japanese Patent Application Laid-Open No. 2006-93399 which is a prior application made by the inventors of the present application.

Figure 2:
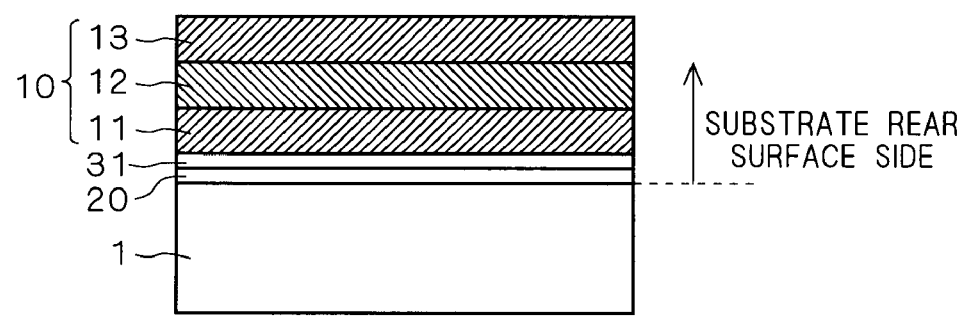
FIG. 2 is an enlarged sectional view of the rear surface of a substrate of the nitride semiconductor device according to the first preferred embodiment.

FIG. 2 is an enlarged sectional view of the rear surface of the GaN substrate 1 of the nitride semiconductor device shown in FIG. 1. In FIG. 2, the rear surface of the GaN substrate 1 is depicted upward, that is, the structure shown in FIG. 1 is turned upside down.

As described above, the surface modified layer 20 and reaction layer 31 are interposed between the GaN substrate 1 and n-type electrode 10. The n-type electrode 10 has a three-layer structure made up of a first metal layer 11, a second metal layer 12 and a third metal layer 13, and the first metal layer 11 is connected to the GaN substrate 1 with the surface modified layer 20 and reaction layer 31 interposed therebetween. The first metal layer 11 is made of, e.g., Ti, and the second metal layer 12 is made of, e.g., Pt, and the third metal layer 13 is made of, e.g., Au. This reduces a Schottky barrier between the n-type electrode 10 and GaN substrate 1 and achieves good low-resistance ohmic characteristics. Another metal layer may be provided between the first and second metal layers 11 and 12 or second and third metal layers 12 and 13 according to necessity.

A manufacturing method of the nitride semiconductor device according to the present embodiment, particularly, the process of forming the electrode structure on the rear surface of the GaN substrate 1 shown in FIG. 2 will now be described. It is noted that the n-type AlGaN cladding layer 2, n-type GaN guide layer 3, active layer 4, p-type GaN guide layer 5, p-type AlGaN cladding layer 6, p-type GaN contact layer 7, p-type electrode 8 and $SiO_2$ film 9 on the front surface side of the GaN substrate 1 shown in FIG. 1 shall be formed similarly to a conventional technique (techniques disclosed in the aforementioned four documents, for example), and detailed description will be omitted in the present specification.

In the manufacturing method of the nitride semiconductor device according to the present embodiment, the rear surface of the GaN substrate 1 is first subjected to polishing/grinding for making the GaN substrate 1 thin.

Grinding/Polishing Process

A specific example of grinding/polishing process includes: grinding first the rear surface of the GaN substrate 1 by about 200 to 300 μm using a grinding machine; then planarizing the ground surface using a diamond slurry; and finally polishing by a polishing cloth using the diamond slurry as a polishing material.

Pretreatment

Next, the rear surface of the GaN substrate 1 is subjected to a predetermined pretreatment.

A specific example of the predetermined pretreatment includes oxygen plasma treatment, BHF treatment or the like for removing contamination.

Plasma Treatment

Next, the rear surface of the GaN substrate 1 is subjected to a plasma treatment.

A specific example of the plasma treatment may include high frequency ICP (inductively coupled plasma), RIE (reactive ion etching), dry etching by ECR (electron cyclotron resonance) or the like.

While an etching gas used in this treatment is a mixed gas of $SiCl_4$ having remarkable deposition properties and Ar, alternatively, $SiCl_4$ may be replaced by a compound of a Group IV element other than Si or a Group VI element and chlorine. The Group IV element has one more valence electron than Ga which is a Group III element, and the Group VI element has one more valence electron than N which is a Group V element, and they react as an n-type element. Therefore, a plasma treatment using such gas can modify the surface of the GaN substrate 1 to have a high carrier density.

Making the rear surface of the GaN substrate 1 react with Si-containing plasma causes GaN and Si to react with each other, so that the surface modified layer 20 is generated. This layer is formed on the outermost surface or one to two layers of the GaN substrate 1 as described above. Accordingly, increasing the surface roughness (radius) Ra by limiting the polishing process to mechanical polishing, to thereby increase the area of the rear surface of the GaN substrate 1, which may further promote resistance drop.

Deposited Layer Thickness Control

Since $SiCl_4$ has remarkable deposition properties as described above, a thin insulation film (high resistance film) is deposited as a deposited material to cover the surface modified layer 20 after the plasma treatment. Therefore, depositing an electrode directly on the surface modified layer 20 covered with the deposited material results in a high resistance, which arises the necessity to perform high heat treatment in order to reduce the resistance. To eliminate the necessity, the deposited material needs to be removed.

To remove such deposited material, etching by means of an acid treatment has conventionally been employed. With the acid treatment for removing a deposited material, however, acid etches not only the deposited material but also the surface modified layer 20, causing the carrier supplying layer having been formed to be removed. As a result, even when low-resistance ohmic characteristics are obtained just after the deposition of electrode, heat treatment necessary for device assembly increases the resistance. The present invention focuses attention to this point, and intended to remove the deposited material partially, not the whole.

More specifically, in order to avoid resistance rise, the deposited material needs to be removed while leaving it suitably to such an extent that the surface modified layer 20 underlying the deposited material is not removed (in other words, the deposited material needs to be removed partially). Hereinafter, the thickness of deposited material that allows avoidance of resistance rise will be described with reference to FIGS. 3 to 5. In FIGS. 3 to 5, the pattern a results from too small thickness; the pattern b, moderate thickness; and the pattern c, too large thickness.

FIG. 3 is a graph schematically showing the relationship between the thickness of deposited material and voltage when a constant current flows between adjacent two n-type electrodes 10 (hereinafter also simply called an electrode-to-electrode voltage) prior to sintering after the deposition of electrode (yet-to-be-sintered state). Since the contact resistance at the n-type electrode 10 increases as the thickness of deposited material increases, the electrode-to-electrode voltage also increases, as shown in FIG. 3.

Sintering in a nitrogen atmosphere after the deposition of electrode causes the electrode material such as Ti having high reactivity to react with the semiconductor surface and the deposited material interposed therebetween to absorb the deposited layer, so that a conductive reaction layer is generated. Thus, sintering reduces the resistance even when the resistance is high in the yet-to-be-sintered state. A temperature at which the resistance starts to drop will be called resistance-drop start temperature. In the case where the resistance is originally low, there is no such resistance-drop start temperature.

On the other hand, raising the sintering temperature higher after the resistance drop causes the electrode material to absorb atoms, which are sources of carriers, from the semiconductor surface, so that the contact resistance finally increases. A temperature at which the contact resistance starts to rise will be called resistance-rise start temperature.

FIG. 4 is a graph schematically showing the relationship between the thickness of deposited material and resistance-drop start temperature. As shown in FIG. 4, the resistance-drop start temperature increases as the thickness of deposited material increases. FIG. 5 is a graph schematically showing the relationship between the thickness of deposited material and resistance-rise start temperature. As shown in FIG. 5, the resistance-rise start temperature increases as the thickness of deposited material increases.

In summary, both the resistance-drop start temperature and resistance-rise start temperature are raised as the thickness of deposited material increases, as shown in FIGS. 4 and 5. Therefore, the thickness of deposited material is preferably small in order to lower the resistance-drop start temperature, but too small thickness also lowers the resistance-rise start temperature, thus requiring the deposited material to be partially removed so as to obtain a moderate thickness, not too large, not too small.

The present embodiment focuses attention to that the deposited material is water-soluble, and partially removes the deposited material by cleaning with deionized water. This allows the deposited material to be partially left only on the outermost surface of the surface modified layer 20 to generate a deposited layer 30 (range of its thickness will be described later).

Asher Process

Next, an oxygen plasma treatment is carried out by an oxygen asher. This oxidizes part of the surface modified layer 20 and deposited layer 30 and dopes oxygen or introduces nitrogen defects into the surface modified layer 20 and deposited layer 30, to thereby increase the carrier density and improve the carrier supplying capability. Further, this removes the source of contamination resulting from carbon to improve adhesion.

Electrode Deposition Process

Next, for example, the first metal layer made of Ti, second metal layer made of Pt and third metal layer 13 made of Au to constitute the n-type electrode 10 are deposited sequentially on the rear surface of the GaN substrate 1 by an electron beam (EB) deposition technique or the like. The n-type electrode 10 having three-layered structure of Ti/Pt/Au is thereby generated. At this time, the first metal layer 11 only needs to have a thickness of about 10 to 100 nm. The second metal layer 12 only needs to have a thickness enough to achieve the barrier effect of preventing reaction between the first and third metal layers 11 and 13 in heat treatment to be carried out later, more specifically, about 50 to 100 nm. The third metal layer 13 needs to have a thickness enough to remain even with reaction with solder in the device assembly process, about 200 nm or larger, for example. The n-type electrode 10 is not limited to the three-layered structure of Ti/Pt/Au, but may be of two-layered structure of Ti/Au, for example (in which the first metal layer 11 made of Ti is in contact with the deposited layer 30). Further, Ti is not a restrictive example. The first metal layer 11 containing one or more elements selected from the group consisting of Ti, Al, Ta, Zr and Mo having high reactivity with N and O may be provided in contact with the deposited layer 30, allowing the n-type electrode 10 having good adhesion to be formed.

Patterning Process

Next, the n-type electrode 10 is patterned. More specifically, a resist mask of predetermined pattern is formed on the n-type electrode 10, and wet etching, ion milling or the like is carried out using the resist mask, to remove an unnecessary part of the n-type electrode 10. The resist mask is then removed.

Methods of patterning the n-type electrode 10 include a lift-off method of previously forming a resist of predetermined pattern before deposition of material and removing it after deposition, in addition to the above-described method of forming the resist mask after the deposition of material and carrying out wet etching, ion milling or the like. The lift-off method, however, may cause a chemical solution to act upon the surface of the surface modified layer 20 before the deposition to damage the surface modified layer 20. Therefore, wet etching, ion milling or the like is more preferable than the lift-off method. In particular, ion milling ensures removal of Pt that is difficult to be removed (patterned) by etching.

Heat Treatment

Next, heat treatment is conducted at a temperature ranging from 200 to 450° C. (preferably 280 to 420° C., more preferably 340 to 400° C.). Conducting this heat treatment at a temperature higher than the temperature (about 340° C.) employed in the device assembly process after device manufacturing achieves improved heat stability. Further, limiting the heat treatment to or below the temperature at which the resistance starts to change (400° C.) achieves a low resistance. That is, conducting the heat treatment at 360 to 400° C. allows a low resistance to be obtained with stability. This heat treatment may be omitted when heat treatment in the assembly process is sufficient, and is preferably conducted for a time period ranging from 60 to 300 sec.

Figure 6:
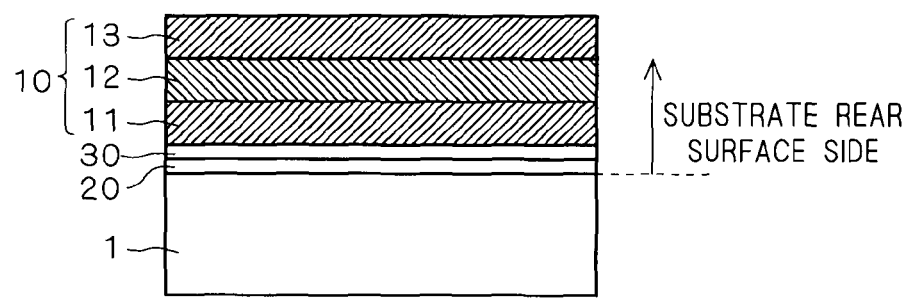
FIG. 6 is an enlarged sectional view of the rear surface of a substrate in a manufacturing method of the nitride semiconductor device according to the first preferred embodiment.

Through the above-described processes, the n-type electrode structure according to the present embodiment is formed on the rear surface of the GaN substrate 1 as shown in FIG. 6.

Figure 7:
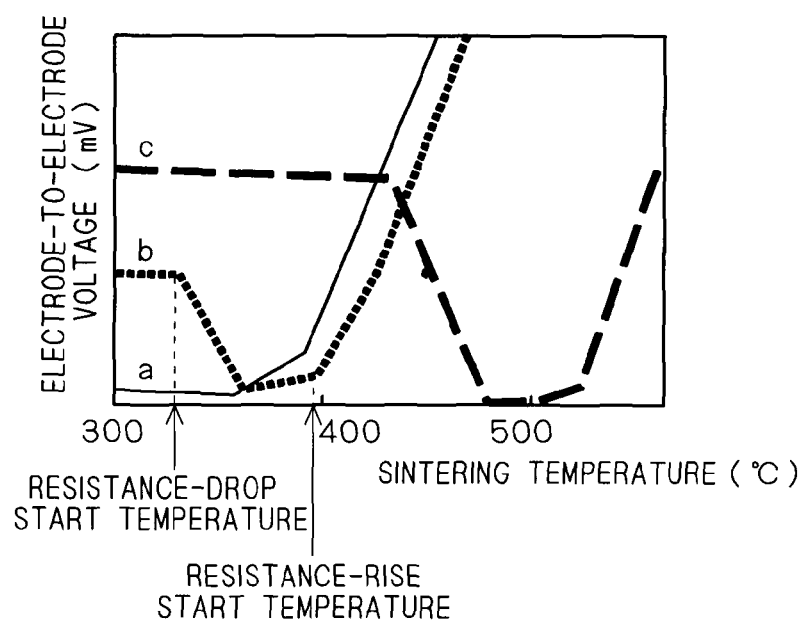
FIG. 7 is a graph showing the relationship between the sintering temperature and electrode-to-electrode voltage in the nitride semiconductor device according to the first preferred embodiment.

FIG. 7 is a graph showing the relationship between the sintering temperature and electrode-to-electrode voltage (i.e., sintering temperature and resistance) when the thickness presents patterns a to c shown in FIGS. 3 to 5.

When the deposited layer 30 has an appropriate thickness as indicated by the pattern b in FIG. 7, Ti contained in the first metal layer 11 and the deposited layer 30 react partially by heat treatment to generate a reaction layer 31, causing the resistance to drop abruptly at a sintering temperature around 340° C. and is minimized at 360° C. (the reaction layer 31 is provided entirely on the interface between the surface modified layer 20 and n-type electrode 10 for ease of illustration in FIGS. 1 and 2, but may practically be partially interposed (scattered) on the interface between the surface modified layer 20 and n-type electrode 10). Therefore, conducting heat treatment at 360° C. allows a lower resistance than conducting heat treatment at other temperatures. This is considered because Ti reacts with the deposited layer 30 to a deeper level as the temperature at heat treatment increases, and heat treatment at 280° C. or higher causes Ti or reactant of Ti and deposited layer 30 to come into contact with the surface modified layer 20 (as the reaction layer 31). Conducting heat treatment at a temperature higher than 400° C. will cause Ti to react even with the surface modified layer 20 to reduce carriers, which conversely increases the resistance.

To maintain a low resistance with heat treatment at about 340° C. necessary for the device assembly process, it is preferable that a high resistance to some degree in the yet-to-be-sintered state shall be reduced to a low resistance so as not to be varied with heat treatment to some degree. Therefore, controlling the resistance in the yet-to-be-sintered state to some low degree as indicated by the pattern b allows variations in resistance in subsequent heat treatment later to be controlled.

Figure 8:
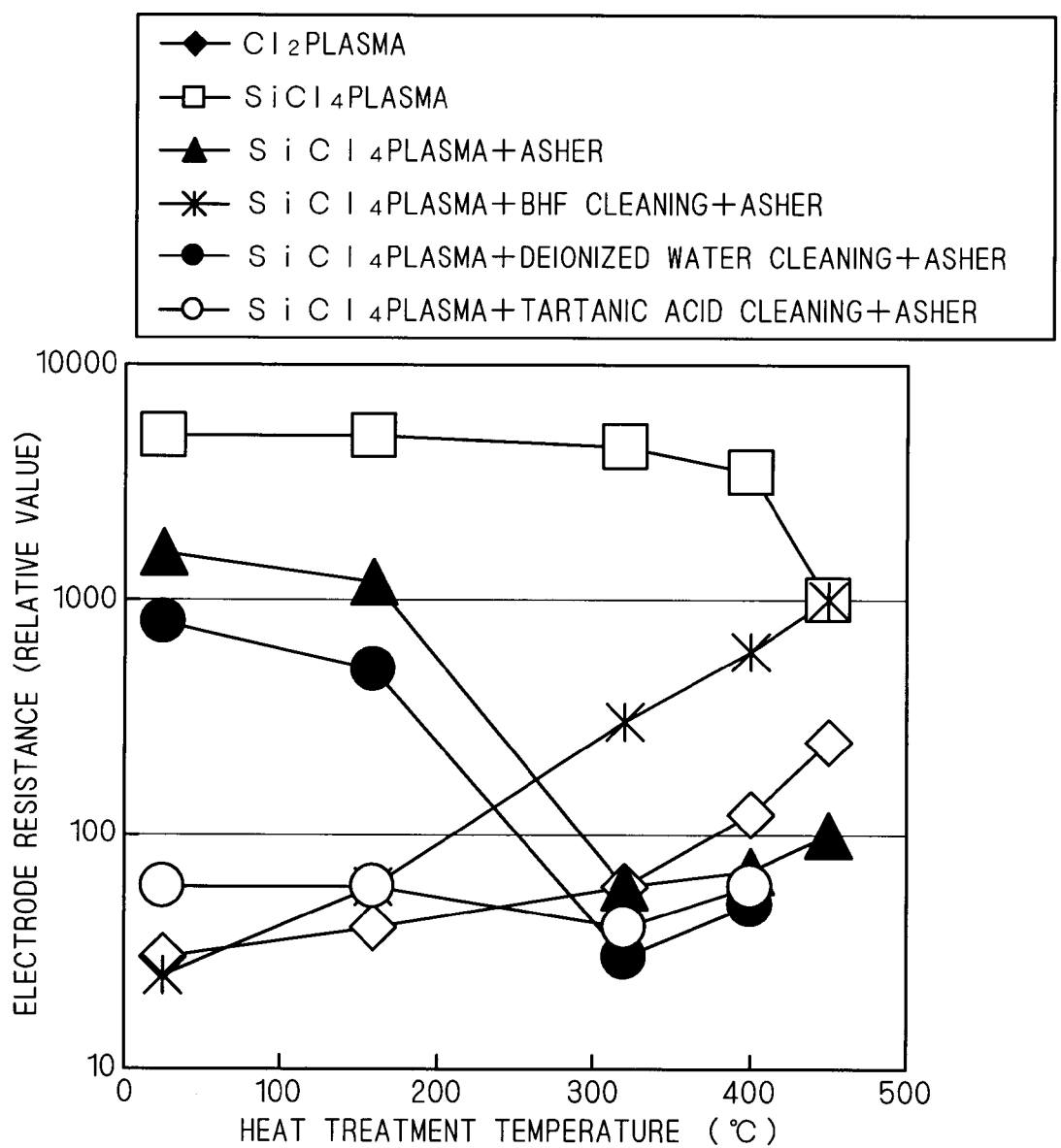
FIG. 8 is a graph showing cleaning fluids suitable for obtaining desired resistance characteristics in the manufacturing method of the nitride semiconductor device according to the first preferred embodiment.

FIG. 8 is a graph showing cleaning fluids (etching agent) suitable for an agent to be used after dry etching for obtaining the resistance characteristics as indicated by the pattern b.

As shown in FIG. 8, when the deposited material is removed by cleaning with deionized water (plotted with marks ●) or cleaning with tartanic acid which is relatively weak acid (plotted with marks ○) to partially generate the deposited layer 30, the electrode resistance drops to minimum around 340° C. employed in the device assembly process (this case corresponds to the pattern b shown in FIG. 7). In the case of cleaning with tartanic acid, cleaning is conducted, for example, with a 50% aqueous solution of tartanic acid and then with deionized water.

In the case of forming the deposited material by the plasma treatment using $SiCl_4$, then partially removing the deposited material by cleaning with deionized water to generate the deposited layer 30, and subjecting the deposited layer 30 to a plasma treatment by an asher, the resistance in the yet-to-be-sintered state is kept low while the electrode resistance abruptly drops around 300° C. employed in the device assembly process (this case corresponds to the pattern b shown in FIG. 7).

In the case of conducting cleaning (etching) using relatively high oxidizing BHF (buffered hydrofluoric acid) after ICP process, and then carrying out a plasma asher, the resistance in the yet-to-be-sintered state is kept low, but sintering lowers the temperature at which the resistance starts to rise (this case corresponds to the pattern a shown in FIG. 7). This is because the deposited layer 30 and surface modified layer 20 are also etched with a strong oxidizing force. When other strong acid such as hydrofluoric acid, hydrochloric acid, sulfuric acid, phosphoric acid, nitric acid, etc. is used instead of BHF, similar results are obtained.

In summary, FIG. 8 shows that the resistance characteristics as indicated by the pattern b in FIG. 7 are obtained by conducting cleaning with weak acid such as an aqueous solution of tartanic acid or deionized water. In the case of using an aqueous solution of tartanic acid, controlling the concentration to range from 5 to 50% and the cleaning time to range from 10 to 200 seconds, for example, allows control of the thickness of the deposited layer 30. The range of sintering temperature that achieves a low resistance can thereby be controlled.

Further, as shown in FIG. 8, the resistance also varies in correspondence with the pattern b shown in FIG. 7 in the case of employing optimized $SiCl_4$ plasma treatment to only carry out an $O_2$ asher after the $SiCl_4$ plasma treatment without conducting cleaning ($SiCl_4$ plasma treatment+asher), which achieves a low resistance by sintering at 360° C. although the resistance is slightly high in the yet-to-be-sintered state.

Auger analysis has revealed that cleaning with deionized water after the $SiCl_4$ plasma treatment allows removal of a treelike adherent material made of Ga oxide grown on the surface of the GaN substrate 1.

A specific range of thickness of the deposited layer 30 will now be described.

As described earlier, heat treatment is conducted within the rage of 200 to 450° C. (preferably 280 to 420° C., more preferably 340 to 400° C.). Therefore, the thickness of the deposited layer 30 may be set such that the electrode-to-electrode voltage when heat treatment is conducted at a temperature within this range has a lower resistance than in the case of conducting heat treatment at a temperature out of this range (i.e., so as to have the lowest resistance in the whole range of temperature) (First condition).

Measurements using Auger analysis has revealed that the above first condition is satisfied when the deposited layer 30 has a thickness of 0.1 to 5 nm (preferably 0.2 to 3 nm) (Second condition). It is known that a low resistance is achieved even in the yet-to-be-sintered state particularly in the case where the thickness is 3 nm or smaller.

It is also known that the first condition is satisfied in the case where the contact resistance just after the deposition of metal for forming the n-type electrode 10 (i.e., prior to heat treatment) ranges from 5 to 50 times the minimum value of the contact resistance after the heat treatment (Third condition).

The third condition corresponds to that the electrode-to-electrode voltage with a current of 100 mA flown between two electrodes ranges from about 250 mV to 2.5 V in the case where 300-by-300-μm n-type electrodes 10 are formed at a 300 μm spacing.

Next, the composition of the deposited layer 30 will be described with reference to FIGS. 9 to 12. These drawings respectively show the results of Auger analysis of: the GaN substrate 1 with the deposited material partially removed therefrom to generate the deposited layer 30 (FIG. 9), GaN substrate 1 with the deposited material formed thereon and yet to be removed partially (FIG. 10), GaN substrate 1 having undergone a plasma treatment using $Cl_2$ rather than $SiCl_4$ (FIG. 11), and GaN substrate 1 having undergone sputtering in a vacuum (FIG. 12).

Figure 9:
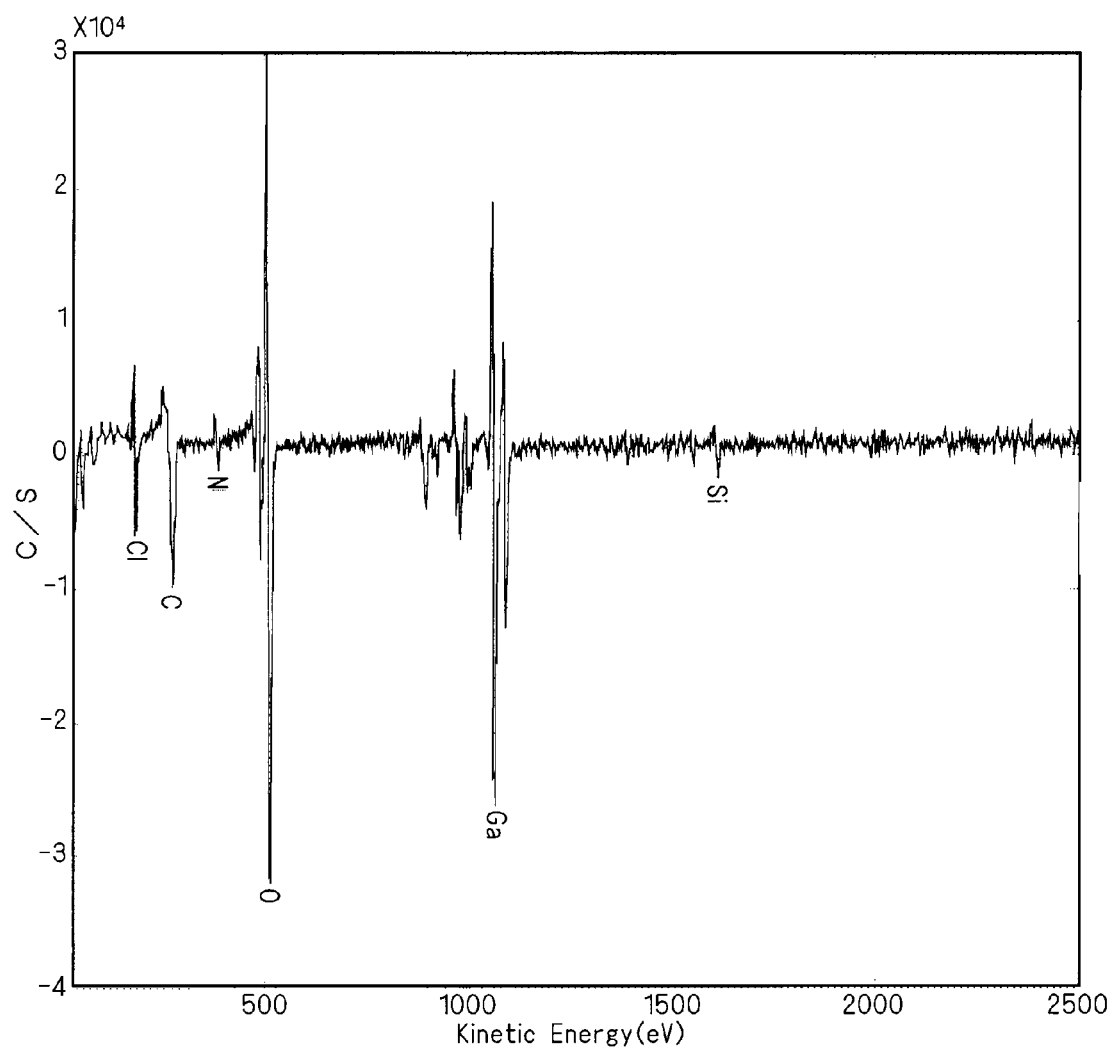
Figure 10:
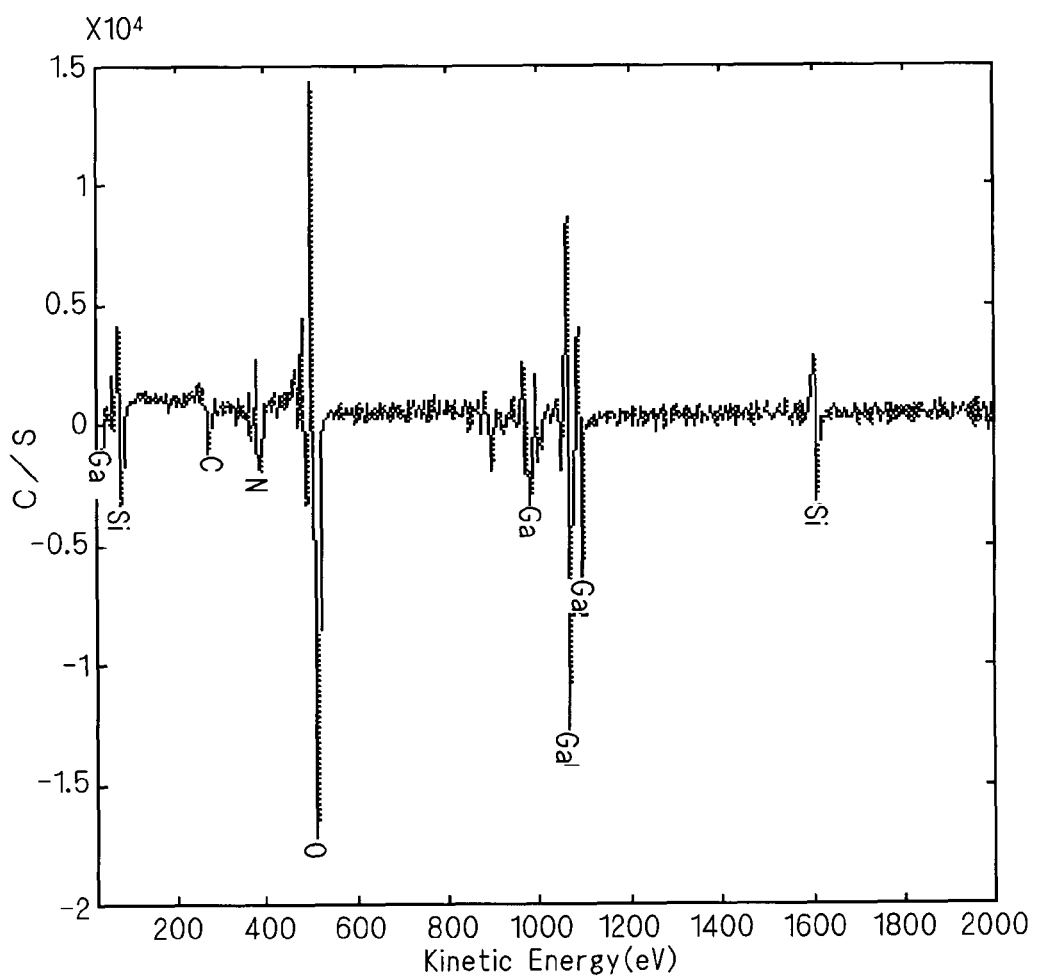
Figure 12:
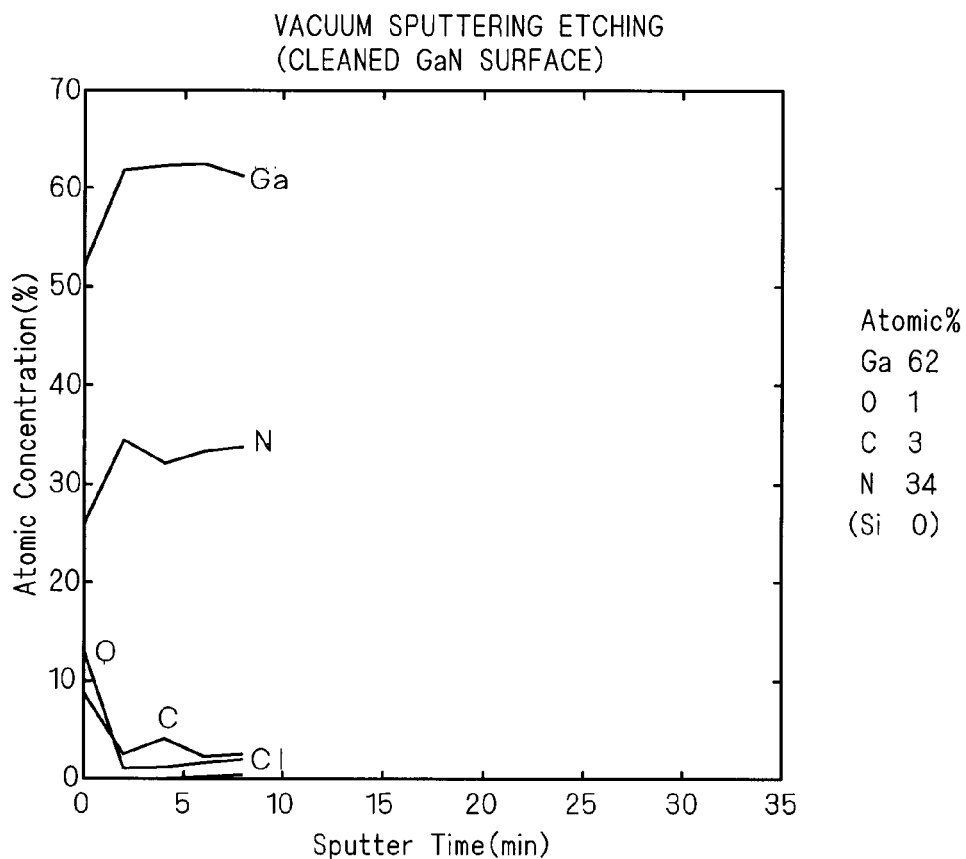

In the results shown in FIGS. 9 and 10 in which the plasma treatment is conducted using $SiCl_4$ to generate a deposited material, a greater amount of Si and a slightly greater amount of O or Cl is detected than in the results shown in FIGS. 11 and 12 in which the plasma treatment is not conducted using $SiCl_4$ or a deposited material is not generated. Therefore, the deposited material (deposited layer 30) is considered as containing Si and further, O or Cl.

Figure 13:
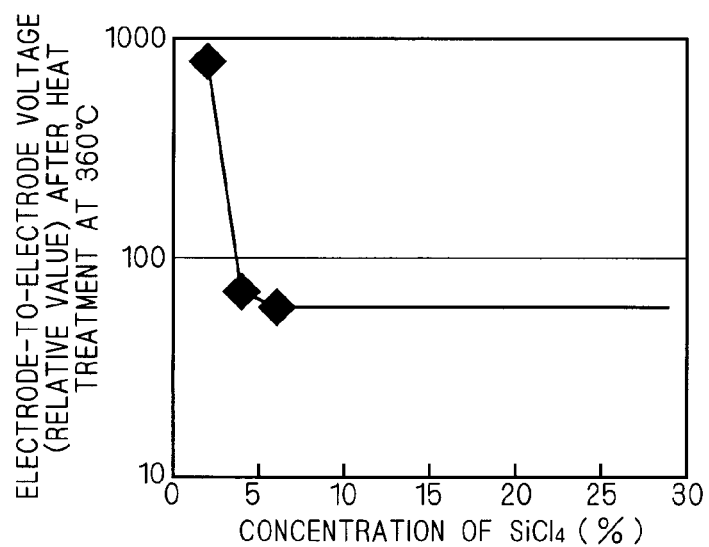
FIG. 13 is a graph showing the concentration of $SiCl_4$ in the manufacturing method of the nitride semiconductor device according to the first preferred embodiment.

Next, the concentration of $SiCl_4$ employed when generating the deposited layer 30 (deposited material) by the plasma treatment will be described with reference to FIG. 13. FIG. 13 is a graph showing the relationship between the concentration of $SiCl_4$ and (n) electrode-to-electrode resistance (relative value after heat treatment at 360° C.).

As shown in FIG. 13, the electrode-to-electrode resistance is high when the concentration is 2%, but abruptly drops at the concentration from 2 to 4%. Therefore, conducting the plasma treatment setting the concentration of $SiCl_4$ at 4% or higher can reduce the electrode-to-electrode resistance.

The present embodiment achieves the effect of maintaining a small contact resistance with reliability even by conducting heat treatment after forming the n-type electrode 10. Thus, the contact resistance of the n-type electrode 10 does not increase even after undergoing temperature changes in the device assembly process. In other words, the contact resistance between the GaN substrate 1 and n-type electrode 10 can be kept low even after the device assembly is completed. This can reduce the operating voltage of the nitride semiconductor device, and lessen the influence exerted by heat, thus achieving stable operating outputs and high power.

The n-type electrode 10 which is a metal electrode is mounted on the rear surface of the GaN substrate 1 with the surface modified layer 20 improved in adhesion by the $SiCl_4$ plasma treatment being interposed therebetween, with the deposited material formed on the surface modified layer 20, which is partially removed (to generate the deposited layer 30) so as not to remove the surface modified layer 20, thus preventing increase in resistance. The surface is further improved in adhesion by oxygen plasma treatment.

Furthermore, Ti contained in the first metal layer 11 and deposited layer 30 react by heat treatment to generate the conductive reaction layer 31, which allows the resistance to be still lower.

In this manner, the nitride semiconductor device and a manufacturing method of the same according to the present embodiment achieves low-resistance ohmic characteristics and good adhesion, which allows a high-performance laser diode to be manufactured at low costs.

While the invention has been shown and described in detail, the foregoing description is in all aspects illustrative and not restrictive. It is therefore understood that numerous modifications and variations can be devised without departing from the scope of the invention.

What is claimed is:

1. A nitride semiconductor device comprising:
   a nitride semiconductor substrate;
   a layered structure of nitride semiconductor element provided on a first main surface of said nitride semiconductor substrate;
   a metal electrode provided on a second main surface of said nitride semiconductor substrate;
   a surface modified layer partially provided on said second main surface and containing one of a group IV element and a group VI element; and
   a reaction layer provided on the side of said surface modified layer on said metal electrode and containing one of said group IV element and said group VI element contained in said surface modified layer and a metal contained in said metal electrode,
   wherein the surface modified layer does not contain metal elements that are contained in said metal electrode.

2. The nitride semiconductor device according to claim 1, wherein
   said reaction layer contains one of Si and O.

3. The nitride semiconductor device according to claim 2, wherein
   said reaction layer further contains Cl.

4. The nitride semiconductor device according to claim 1, wherein
   the reaction layer consists of
      the one of said group IV element and said group VI element contained in said surface modified layer;
      the metal contained in said metal electrode; and,
      optionally, at least one of oxygen, nitrogen and chlorine.

5. The nitride semiconductor device according to claim 4, wherein
   the one of said group IV element and said group VI element contained in said surface modified layer is Si.

6. The nitride semiconductor device according to claim 4, wherein
   the metal contained in said metal electrode is Ti.

7. The nitride semiconductor device according to claim 4, wherein
   the oxygen is in the reaction layer.

8. The nitride semiconductor device according to claim 4, wherein
   the nitrogen is in the reaction layer.

9. The nitride semiconductor device according to claim 4, wherein
   the chlorine is in the reaction layer.

10. A nitride semiconductor device comprising:
   a nitride semiconductor substrate;
   a layered structure of nitride semiconductor element provided on a first main surface of said nitride semiconductor substrate;
   a metal electrode provided on a second main surface of said nitride semiconductor substrate;
   a surface modified layer partially provided on said second main surface and containing one of a group IV element and a group VI element; and
   a reaction layer provided on the side of said surface modified layer on said metal electrode and containing one of said group IV element and said group VI element contained in said surface modified layer and a metal contained in said metal electrode,
   wherein the metals in the surface modified layer are different from the metals in the metal electrode.

* * * * *